United States Patent [19]
Eitrheim

[11] Patent Number: 5,638,016
[45] Date of Patent: Jun. 10, 1997

[54] ADJUSTABLE DUTY CYCLE CLOCK GENERATOR

[75] Inventor: John K. Eitrheim, Plano, Tex.

[73] Assignee: Cyrix Corporation, Richardson, Tex.

[21] Appl. No.: 424,768

[22] Filed: Apr. 18, 1995

[51] Int. Cl.⁶ .......................... H03K 5/14; H03K 5/159; H03K 5/04
[52] U.S. Cl. .................. 327/175; 327/176; 327/299; 327/35
[58] Field of Search ........................ 327/175, 176, 327/172, 291, 299, 36, 35, 31, 217, 34, 173, 174, 227, 228, 229, 197, 276, 277

[56] References Cited

U.S. PATENT DOCUMENTS

| | | | |
|---|---|---|---|
| 4,051,390 | 9/1977 | Reeves | 327/176 |
| 4,141,033 | 2/1979 | de Boer | 327/175 |
| 4,675,546 | 6/1987 | Shaw | 327/176 |
| 4,985,640 | 1/1991 | Grochowski et al. | 327/175 |
| 5,317,202 | 5/1994 | Waizman | 327/156 |
| 5,336,939 | 8/1994 | Eitrheim et al. | 327/172 |
| 5,359,232 | 10/1994 | Eitrheim et al. | 327/175 |
| 5,418,485 | 5/1995 | Duret et al. | 327/58 |

FOREIGN PATENT DOCUMENTS

| | | | |
|---|---|---|---|
| 5308244 | 11/1993 | Japan | 327/172 |
| 690148 | 3/1994 | Japan | 327/291 |
| 6209242 | 7/1994 | Japan | 327/175 |
| 6224708 | 8/1994 | Japan | 327/175 |
| 1396260 | 5/1988 | U.S.S.R. | 327/175 |

*Primary Examiner*—Timothy P. Callahan
*Assistant Examiner*—Terry L. Englund
*Attorney, Agent, or Firm*—Andrew S. Viger; John L. Maxin

[57] ABSTRACT

An adjustable duty cycle clock generator has first and second delay lines coupled to receive an input clock and cascaded to first and second edge detectors, respectively. The second delay line has a programmable delay and the first and second edge detectors are further coupled to set and reset inputs on an S-R latch to generate an adjustable duty cycle clock with independently adjustable high and low times proportional to the induced delays of the first and second delay lines.

15 Claims, 6 Drawing Sheets

ADJUSTABLE DUTY CYCLE CLOCK GENERATOR

CROSS-REFERENCES TO RELATED APPLICATIONS

This patent is related to commonly assigned U.S. patent application Ser. No. 08/413,199 (now U.S. Pat. No. 5,550,499) entitled "Single Delay Line Adjustable Duty Cycle Clock Generator", concurrently filed herewith.

BACKGROUND OF THE INVENTION

1. Field of the Invention

The invention relates generally to a clock generator, and more specifically, to an adjustable duty cycle clock generator which is particularly useful in latch based logic designs.

2. Description of Related Art

By way of background, most non-combinational logic designs broadly fall into one of two categories namely: flip/flop based designs or latch based designs. While most application specific integrated circuits (ASIC) fall under the flip/flop based design category, high performance circuits generally rely on latch based designs.

A flip/flop based design and its limitations are best understood with reference to FIG. 3 and the description given hereinbelow. A flip/flop register 10 includes a first D-type latch 12 cascaded with a second D-type Latch 14. The first D-type latch 12 has its D-input coupled to the input data, its clock input to the input clock signal (i.e. the $\phi 1$ clock) and its output to the D-input on the second D-type latch 14. The second D-type latch 14 has its clock input coupled to the inversion of the $\phi 1$ clock (i.e. the $\phi 2$ clock) and its output supplies the latched data. The double clocking by $\phi 1$ and $\phi 2$ is performed, for the most part, to decouple speed paths and to prevent metastable conditions from occurring between the input data and the latched data output. It can be seen therefore, that the latched data output cannot change except at the rising edges of $\phi 2$ clocks. Thus the speed to which a synchronous flip/flop design can operate is limited by the propagation delay through the combinational logic between flip/flops during one clock period. The speed is independent of the duty cycle of the clock.

A latch based design is similar to a flip/flop based design except that the latched data output is split into two data paths which are made available either on the $\phi 1$ or $\phi 2$ clock. This approach is used in high performance microprocessor designs as an expedient to obtain advantages in speed, circuit element reduction, and power conservation. Speed improvement occurs since different operations may be performed during each clock phase. For example, a programmable logic array (PLA), random access memory (RAM), or address/data bus may be precharged during one clock phase, then accessed during the next clock phase. Circuit element reduction occurs since fewer D-type latches are needed. Power consumption is reduced because a so-called "conditional" or "gated clock" latch can be constructed, inhibiting the unnecessary clocking of latches when input data has not changed or is irrelevant.

By way of example, an exemplary conditional data latch is depicted in FIG. 4 illustrating a "gated" $\phi 2$ clock. A first D-type latch 16 is clocked by $\phi 1$ and has its latched output coupled to a cluster of combinational logic 18 which generates a first term to a first input on logic AND gate 20. A second input on AND gate 20 is coupled to the $\phi 2$ clock which is usually the inversion of the $\phi 1$ clock. The output of AND gate 20 generates a "gated" clock signal to a clock input on a second D-type latch 22 whose data input may originate from the cluster of combinational logic 18, another cluster of combinational logic (not shown), or another $\phi 1$ or $\phi 2$ latch (not shown).

Along with the advantages of a conditional latch based design however, are the attendant problems associated with commingling combinational and latch based logic. For example, the delay of the cluster of combinational logic 18 can cause the AND gate 20 to miss or generate a false gated $\phi 2$ clock signal. This point is best illustrated with reference to the timing diagram in FIG. 5. As depicted in FIG. 5, the output of latch 16 ($Q_{16}$) goes high in response to the input $D_{16}$ being high and the rising edge of the $\phi 1$ clock. $Q_{16}$ then stimulates combinational logic 18 to produce the first input ($O_{18}$) to AND gate 20. $O_{18}$ is usually delayed a time (t) later than $Q_{16}$ due to gate delays associated with combinational logic 18. If t is too large and $O_{18}$ is switching low as depicted in FIG. 5, AND gate 20 will temporarily go high at the rising edge of the $\phi 2$ clock, and consequently, latch 22 will be updated on a cycle that it should have held its previous state. Ostensibly, this situation cannot be tolerated for a reliable design.

In an attempt to ameliorate this problem, logic designers have either imposed a minimum period on the $\phi 1$ and $\phi 2$ clocks (i.e. limited the frequency) to augment the safety margin between $\phi 1$ and $\phi 2$ rising edges or have reduced the amount of delay time (t) induced by combinational logic 18. Unfortunately, limiting the operating frequency of the $\phi 1$ and $\phi 2$ clocks results in limited or poor performance. Similarly, reducing the amount of delay time (t) induced by combinational logic 18 is limited by the amount of functionality sought and the process technology used to fabricate the combinational logic 18.

By way of further background, in previous latch based designs, much emphasis was placed on de-skewing the generated clock from the source clock and on maintaining a 50% duty cycle. The notion of a 50% duty cycle for $\phi 1$ and $\phi 2$ was that the data set-up time could be equally shared between $\phi 1$ to $\phi 2$ latch transfers and $\phi 2$ to $\phi 1$ latch transfers. Generally speaking however, time delays are not evenly distributed between $\phi 1$ to $\phi 2$ and $\phi 2$ to $\phi 1$ data paths. Consequently, using a 50% duty cycle clock generally results in a lower than obtainable operating frequency since the clock speed must take into account the worst case speed path, thus leaving slack in the clock phase which does not contain the worst case speed path.

Accordingly it can be seen from the foregoing that without jeopardizing reliability, it is desirable to maximize the clock speed for a latch based design without sacrificing functionality.

SUMMARY OF THE INVENTION

To overcome the limitations of the prior art described above, and to overcome other limitations that will become apparent upon reading and understanding the present specification, the present invention discloses an adjustable duty cycle clock generator having first and second delay lines coupled to receive an input clock and cascaded to first and second edge detectors, respectively. The first and second edge detectors are further coupled to set and reset inputs on an S-R latch to generate an adjustable duty cycle clock proportional to the induced delays of the first and second delay lines.

A first embodiment provides programmable first and second delay lines to separately adjust the high and low time of the clock output.

A second embodiment provides a fixed (offset) first delay line and a programmable second delay line to adjust the high or low t/me of the clock output.

A third embodiment provides a second S-R latch cross coupled in parallel with respect to the S-R inputs to the first S-R latch, for generating a second clock signal substantially 180° out of phase with the first clock signal.

A feature of the present invention is the ability in a latch based system, to optimize temporal relationships between first and second data paths without compromising clock speed.

This and various other objects, features, and advantages of novelty which characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described a specific example of an adjustable duty cycle clock generator practiced in accordance with the present invention.

DESCRIPTION OF THE PREFERRED EMBODIMENTS

In the following description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Figure 1:
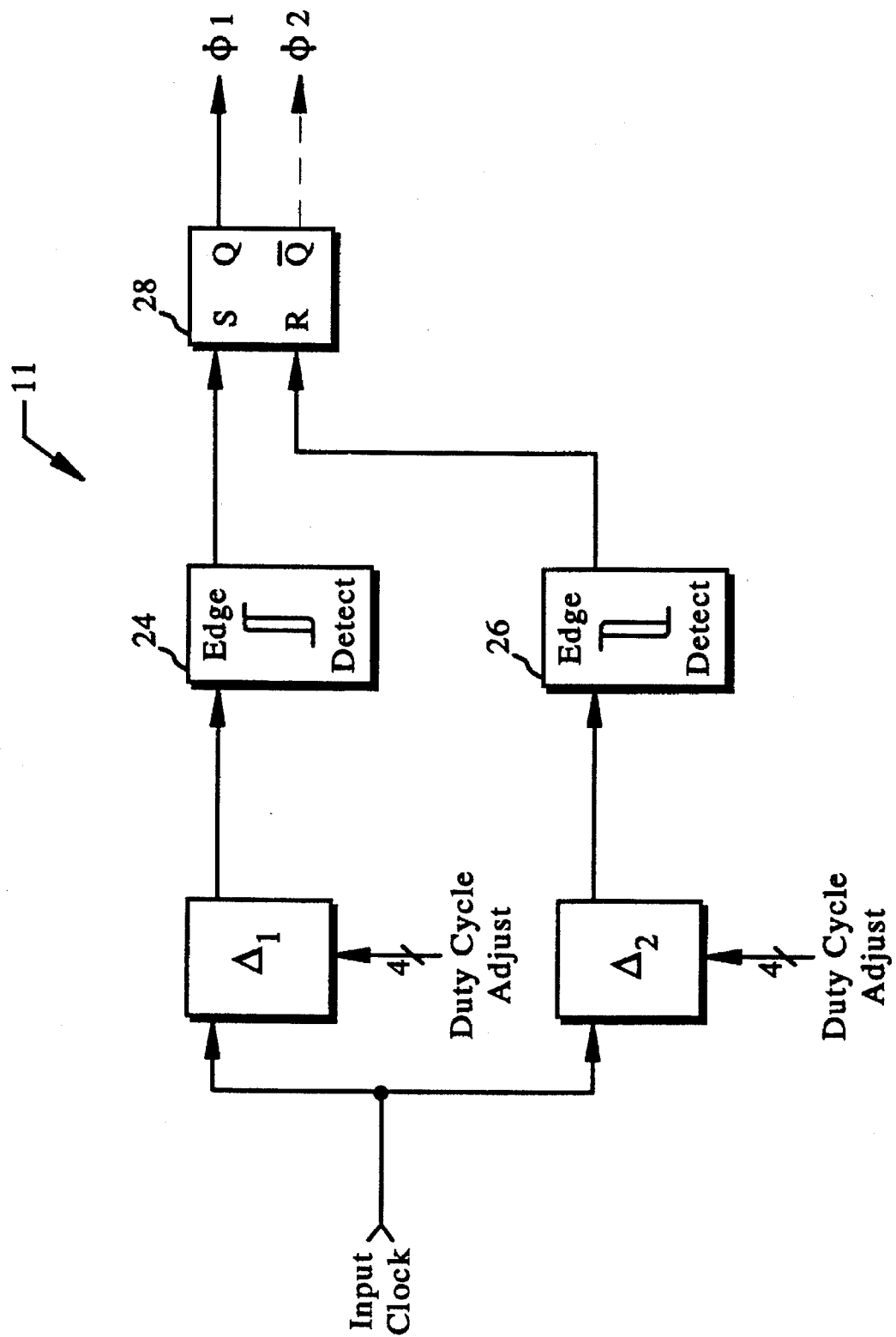
FIG. 1 is a block diagram of a first preferred embodiment of an adjustable duty cycle clock generator, practiced in accordance with the principles of the present invention.

Referring to FIG. 1, a block diagram of an adjustable duty cycle clock generator 11 is depicted in accordance with the principles of the present invention. An input clock is coupled to first and second delay lines Δ1 and Δ2. The outputs from first and second delay lines Δ1 and Δ2 are coupled to first and second edge detectors 24 and 26, respectively. First edge detector 24 preferably detects rising (low-to-high) edges occurring out of Δ1 and generates a short pulse in response thereto. Second edge detector 26 preferably detects falling (high-to-low) edges occurring out of Δ2 and generates a short pulse in response thereto. The output of first edge detector 24 is coupled to the set input of an S-R latch 28. The output of second edge detector 26 is coupled to the reset input of an S-R latch 28. The Q output from S-R latch 28 is the φ1 clock output while the /Q is the φ2 clock output.

Figure 6:
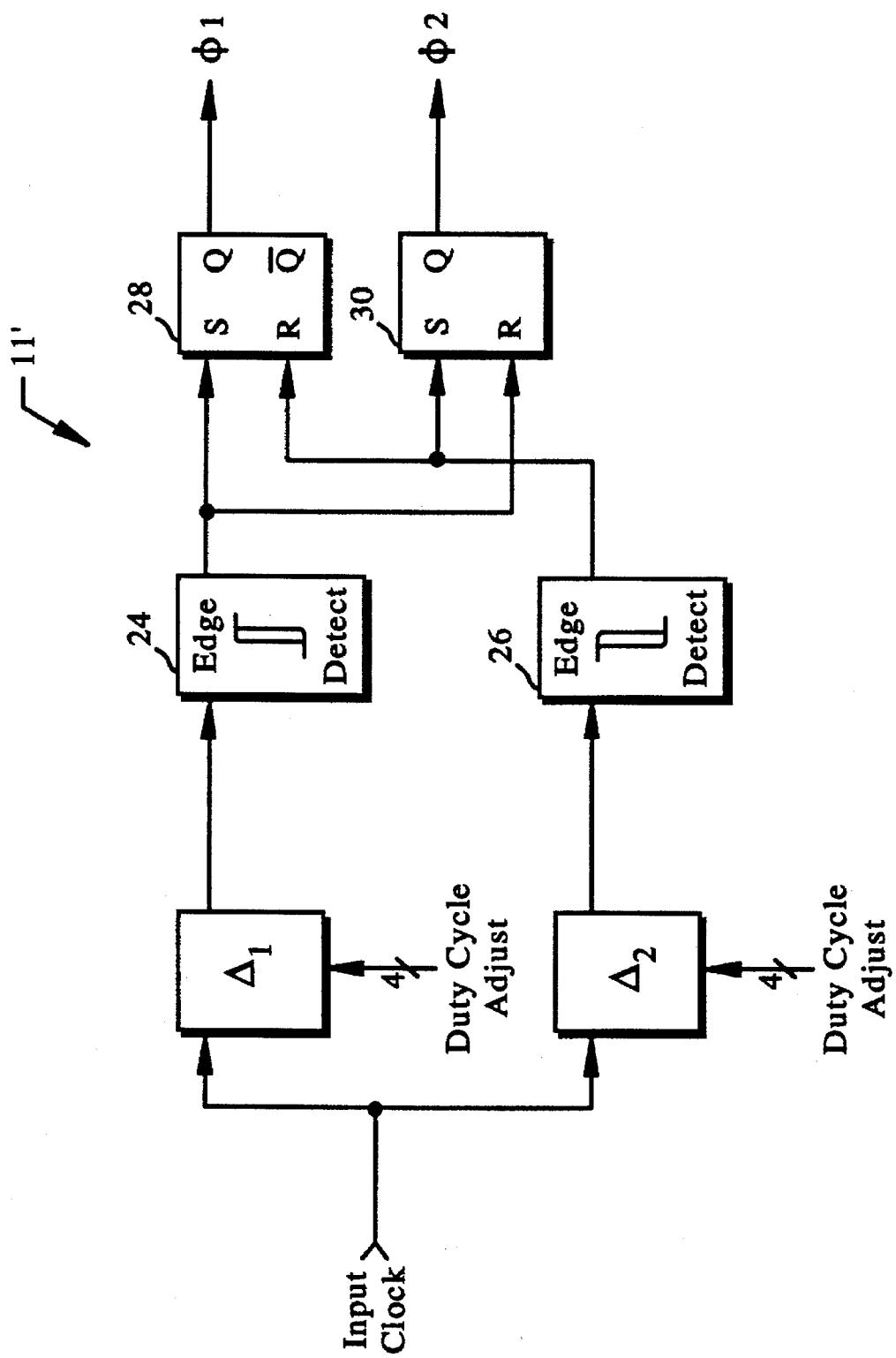
FIG. 6 is a block diagram of a second preferred embodiment of an adjustable duty cycle clock generator, practiced in accordance with the principles of the present invention; and, FIG. 7 is a timing diagram of signals generated in the circuits of FIGS. 1 and 6.

In an alternative embodiment 11' depicted in FIG. 6, a second S-R latch 30 is cross coupled in parallel with respect to the S-R inputs to the first S-R latch 28 to generate a φ2 dock signal substantially 180° out of phase with the φ1 dock signal. While it is contemplated that the input dock will have a 50% duty cycle, any duty cycle will suffice. The input dock may originate from a central system dock generator, a phase-locked loop, or a delay line loop.

Figure 2:
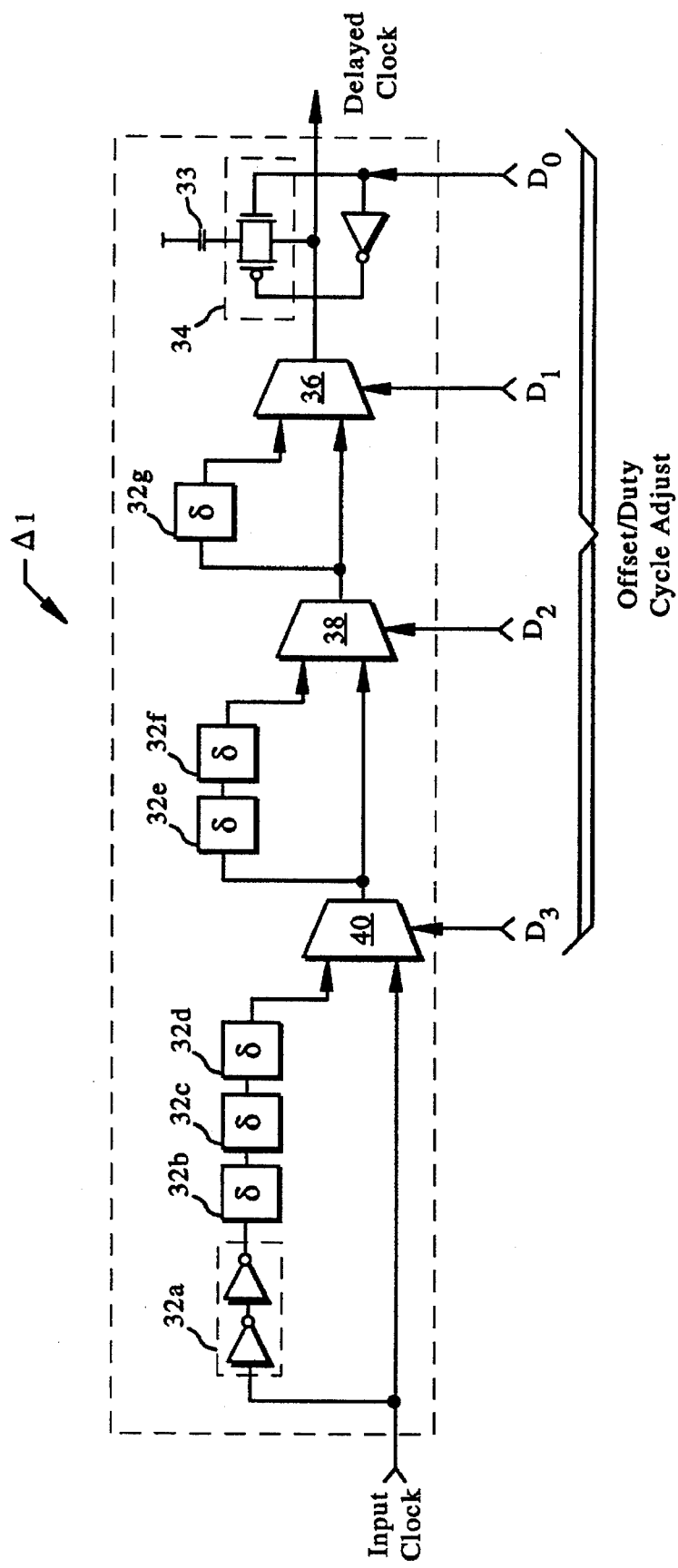
FIG. 2 is a detailed block diagram of a preferred embodiment for delay lines Δ1 and Δ2 depicted in FIG. 1.
Figure 3:
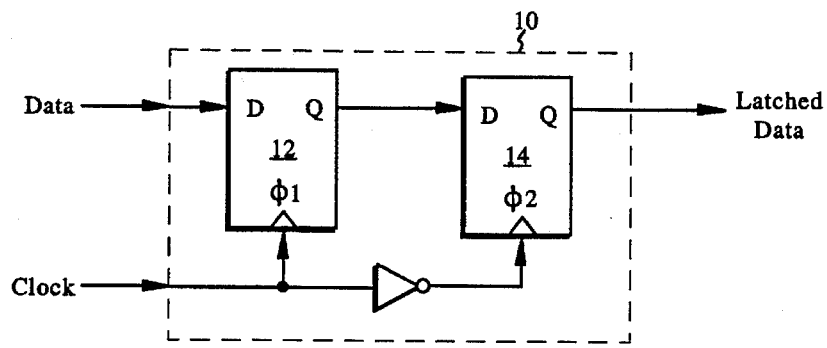
FIG. 3 is a prior art schematic diagram of a flip/flop based logic design.
Figure 4:
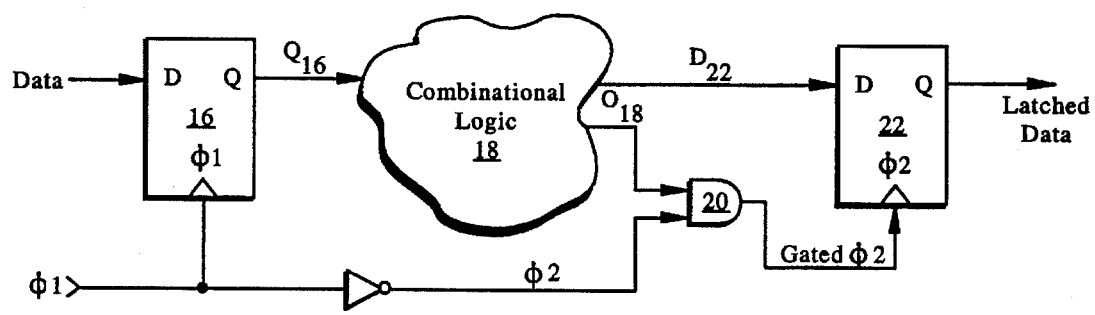
FIG. 4 is a prior art schematic diagram of a latch based logic design.
Figure 5:
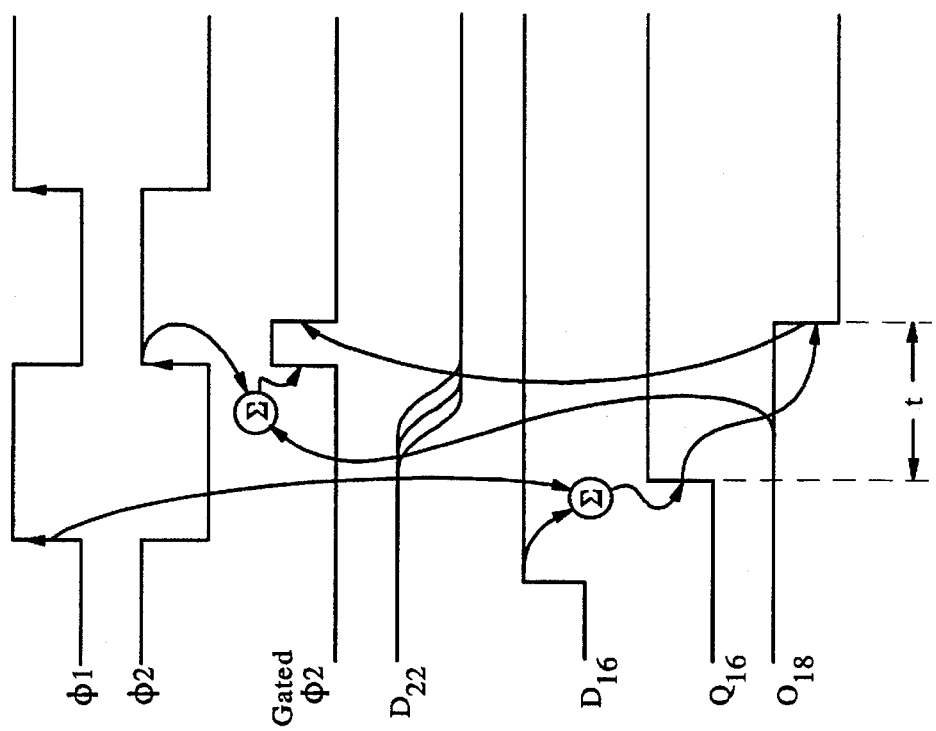
FIG. 5 is a prior art timing diagram of signals generated in the circuit of FIG. 4.

Reference is now made to FIG. 2 which depicts a more detailed block diagram of the preferred embodiment for delay lines Δ1 and Δ2. In the preferred embodiment, delay lines Δ1 and Δ2 are substantially identical, therefore for purposes of discussion, only Δ1 is described. It should be understood however, that with the aid of the present disclosure, those skilled in the art will readily recognize other configurations for delay lines Δ1 and Δ2 without departing from the scope of the present invention. Delay line Δ1 is a four bit ($D_3$–$D_0$) digitally programmable delay. The four bits selectably induce one of sixteen delay values into the data path between the input clock and the delayed clock. Preferably, the four bits are dynamically altered through a test register in response to execution of a test mode to determine the optimal setting and then hard-wired to logic values with bond wires.

The least significant bit ($D_0$) selects the minimum discrete delay value (0.5δ), by switching pass gate 34 on to introduce capacitor 33 to the data path. The capacitor 33 delays the input clock signal on the data path by a predetermined value (0.5δ). In the preferred embodiment, the Applicant has tuned the value for capacitor 33 so that 0.5δ matches the delay through a single inverter.

The next increment in delay is δ (32a–32g) which is schematically depicted as two cascaded inverters in 32a. Data bit $D_1$ controls a first multiplexer 36 having a first input coupled to the data path and a second input coupled to the data path delayed by one δ(32g). Hence, data bit $D_1$ either selects a single delay (32g) into the data path or allows the clock signal on the data path to flow through to pass gate 34.

Data bit $D_2$ controls a second multiplexer 38 having a first input coupled to the data path and a second input coupled to the data path delayed by two δs (32e–32f). The output of multiplexer 38 drives both the first input on multiplexer 36 and the second input on multiplexer 36 delayed by single delay (32g). Hence, data bit $D_2$ either inserts two delays (32e–32f) into the data path or allows the signals on the data path to flow through to the first and the second (delayed) inputs on multiplexer 36.

Data bit $D_3$ controls a third multiplexer 40 having a first input coupled to the data path and a second input coupled to the data path delayed by four δs (32a–32d). The output of multiplexer 40 drives both the first input on multiplexer 38 and the second input on multiplexer 38 delayed by two δs (32e–32f). Hence, data bit $D_3$ either inserts four delays (32e–32f) into the data path or allows the signals on the data path to flow through to the first and second (delayed) inputs on multiplexer 38. It should be understood therefore, that any one of sixteen cumulative delays can be induced into the data path by choosing an appropriate pattern for $D_3$–$D_0$. These delays and relationship to data bits D–$D_0$ are depicted in Table 1.

TABLE 1

| $D_3$ | $D_2$ | $D_1$ | $D_0$ | Delay |
|---|---|---|---|---|
| 0 | 0 | 0 | 0 | None |
| 0 | 0 | 0 | 1 | .5δ |
| 0 | 0 | 1 | 0 | δ |
| 0 | 0 | 1 | 1 | 1.5δ |
| 0 | 1 | 0 | 0 | 2δ |
| 0 | 1 | 0 | 1 | 2.5δ |
| 0 | 1 | 1 | 0 | 3δ |
| 0 | 1 | 1 | 1 | 3.5δ |
| 1 | 0 | 0 | 0 | 4δ |
| 1 | 0 | 0 | 1 | 4.5δ |
| 1 | 0 | 1 | 0 | 5δ |
| 1 | 0 | 1 | 1 | 5.5δ |
| 1 | 1 | 0 | 0 | 6δ |
| 1 | 1 | 0 | 1 | 6.5δ |
| 1 | 1 | 1 | 0 | 7δ |
| 1 | 1 | 1 | 1 | 7.5δ |

It should be understood that those skilled in the art, with the aid of the present disclosure, will be able to expand the delay line to more than four bits without departing from the scope of the present invention.

Figure 7:
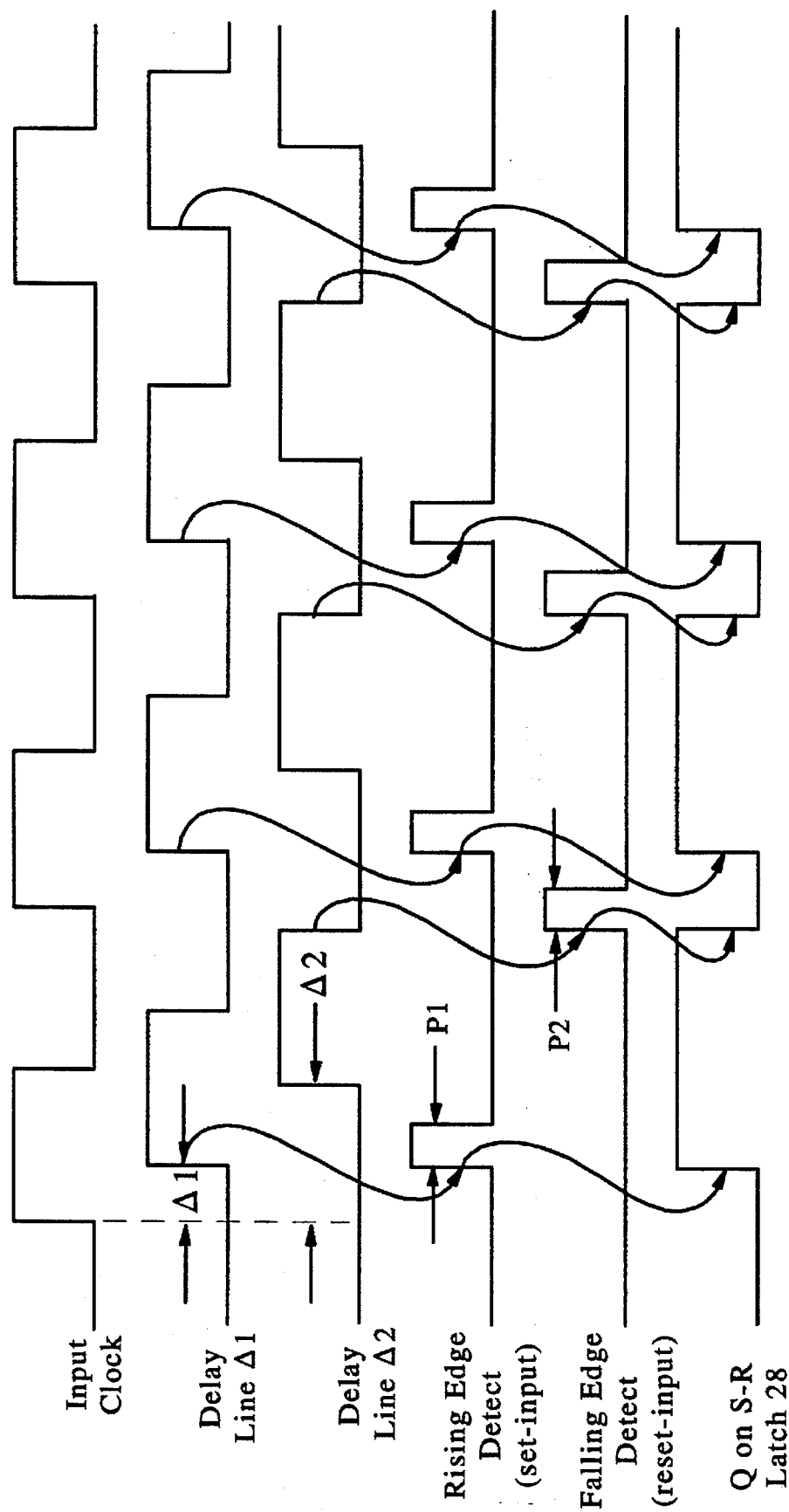

Reference is now made to FIG. 7 which depicts a timing diagram of signals generated in FIGS. 1 and 6 that produce an adjustable duty cycle clock signal in accordance with the principles of the present invention. While the input clock may be of any duty cycle without consequence to the present invention, it is contemplated that a 50% duty cycle input clock will be encountered. Accordingly, the input clock in FIG. 7 is depicted as having a 50% duty cycle. Also in the instant example, the delay of delay line Δ1 is set shorter than the delay of delay line Δ2.

The rising (leading) edge on the output of delay line Δ1 triggers edge detector 24 to generate a first pulse of width $P_1$. Similarly, the falling (trailing) edge on the output of delay line Δ2 triggers edge detector 26 to generate a second pulse of width $P_2$. Widths $P_1$ and $P_2$ are preferably, although not necessarily, equal to one another and are much shorter, individually or collectively, in duration than the period of the input clock. The first pulse $P_1$ sets latch 28 high while the second pulse $P_2$ resets the latch 28 low. Accordingly, by adjusting the relative spacing between $P_1$ and $P_2$ through adjustment of Δ1/Δ2, an adjustable duty cycle clock output is generated by latch 28/latch 30.

CONCLUSION

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the claims.

What is claimed is:

1. An adjustable duty cycle clock generator comprising:
   (a) a first delay line, for delaying an input clock, having an input coupled to receive the input clock and an output;
   (b) a programmable second delay line, for delaying an input clock, having an input coupled to receive the input clock and an output;
   (c) a latch having a set input, a reset input, and an output;
   (d) a first edge detector coupled between the output of the first delay line and the set input on the latch, to detect edges of a first polarity and to generate a pulse only when an edge of the first polarity is detected; and
   (e) a second edge detector coupled between the output of the second delay line and the reset input on the latch, to detect edges of a second polarity opposite that of the first polarity and to generate a pulse only when an edge of the second polarity is detected.

2. The adjustable duty cycle clock generator as recited in claim 1 wherein the first delay line has a fixed delay.

3. The adjustable duty cycle clock generator as recited in claim 1 further comprising (f) a second latch having set and reset inputs cross coupled with respect to the set and reset inputs of the latch in (c) and having a complimentary output to the output of the latch in (c).

4. The adjustable duty cycle clock generator as recited in claim 1 wherein the first edge detector (d) detects rising edges.

5. The adjustable duty cycle clock generator as recited in claim 1 wherein the second edge detector (e) detects failing edges.

6. An adjustable duty cycle clock generator comprising:
   (a) first delay line means, coupled to receive an input clock, for delaying the input clock a first delay time to control low time of an adjustable duty cycle clock signal;
   (b) programmable second delay line means, coupled to receive the input clock, for delaying the input clock a second delay time to control high time of the adjustable duty cycle clock signal;
   (c) first edge detector means, coupled to the first delay line means, for generating a pulse responsive only to detecting an edge on the input clock of a first polarity which was delayed for the first delay time;
   (d) second edge detector means, coupled to the second delay line means, for generating a pulse responsive only to detecting an edge on the input clock of a second polarity opposite that of the first polarity which was delayed for the second delay time; and,
   (e) S-R latch means, responsive to the first and second edge detector means, for generating the adjustable duty cycle clock signal.

7. The adjustable duty cycle clock generator as recited in claim 6 wherein the first delay time is fixed.

8. The adjustable duty cycle clock generator as recited in claim 6 further comprising (f) second S-R latch means cross coupled with respect to the S-R latch means in (e), for further generating a complimentary adjustable duty cycle clock signal.

9. The adjustable duty cycle clock generator as recited in claim 6 wherein the first edge detector means (c) detects rising edges.

10. The adjustable duty cycle clock generator as recited in claim 6 wherein the second edge detector means (d) detects falling edges.

11. A method of generating an adjustable duty cycle clock signal comprising the steps of:
   (a) delaying an input clock signal a first delay time to produce a first delayed signal to control low time of the adjustable duty cycle clock signal;
   (b) delaying the input clock signal a programmable second delay time to produce a second delayed signal to control high time of the adjustable duty cycle clock signal;
   (c) generating a pulse responsive only to detecting an edge of a first polarity on the first delayed signal;
   (d) generating a pulse responsive only to detecting an edge on the second delayed signal of a second polarity opposite that of the first polarity; and, (e) generating the adjustable duty cycle clock signal in response to steps (c) and (d).

12. The method as recited in claim 11 wherein the first delay time in step (a) is fixed.

13. The method as recited in claim 11 further comprising step (f) generating a complimentary adjustable duty cycle clock signal in response to steps (c) and (d).

14. The method as recited in claim 11 wherein the edge in step (c) is a rising edge.

15. The method as recited in claim 11 wherein the edge in step (d) is a falling edge.

* * * * *